United States Patent [19]
Luch

[11] Patent Number: 5,547,516
[45] Date of Patent: Aug. 20, 1996

[54] SUBSTRATE STRUCTURES FOR INTEGRATED SERIES CONNECTED PHOTOVOLTAIC ARRAYS AND PROCESS OF MANUFACTURE OF SUCH ARRAYS

[76] Inventor: Daniel Luch, 17161 Copper Hill Dr., Morgan Hill, Calif. 95037

[21] Appl. No.: 441,552

[22] Filed: May 15, 1995

[51] Int. Cl.$^6$ ........................... H01L 31/05
[52] U.S. Cl. .................. 136/244; 136/256; 264/104; 264/105; 264/177.17; 264/211.12; 264/DIG. 76; 428/58
[58] Field of Search .............. 136/244, 249 MS, 136/256; 264/104–105, 177.17, 211.12, DIG. 76; 428/58

[56] References Cited

U.S. PATENT DOCUMENTS

| | | | |
|---|---|---|---|
| 3,523,875 | 8/1970 | Minklei | 205/184 |
| 3,619,382 | 11/1971 | Lupinski | 205/709 |
| 3,682,786 | 8/1972 | Brown et al. | 205/50 |
| 3,865,699 | 2/1975 | Luch | 205/158 |
| 4,038,042 | 7/1977 | Adelman | 428/625 |
| 4,443,651 | 4/1984 | Swartz | 136/249 |
| 4,603,092 | 7/1986 | Luch | 428/626 |
| 4,697,041 | 9/1987 | Okaniwa et al. | 136/244 |
| 4,724,011 | 2/1988 | Turner et al. | 136/249 |
| 4,746,618 | 5/1988 | Nath et al. | 427/2 |
| 4,754,544 | 7/1988 | Hanak | 437/2 |
| 4,769,086 | 9/1988 | Tanner et al. | 136/249 |
| 4,965,655 | 10/1990 | Grimmer et al. | 257/56 |
| 5,021,099 | 6/1991 | Kim et al. | 136/249 |
| 5,385,848 | 1/1995 | Grimmer | 437/2 |
| 5,441,577 | 8/1995 | Sasaki et al. | 136/244 |

FOREIGN PATENT DOCUMENTS

| | | | |
|---|---|---|---|
| 4-120773 | 4/1992 | Japan | 136/244 |

OTHER PUBLICATIONS

Saubestre, E. B., Plating on Plastics: Current Status of Processes and Standards, Trans. of Institute of Metal Finishing, 1969, vol. 47.
Arcilesi et al., Advances in Plating Technology for EMI Shielding, Products Finishing, Mar. 1984.
"Electroplating and Sputtering". Modern Plastics, Oct., 1991, pp. 358–359.

Primary Examiner—Aaron Weisstuch

[57] ABSTRACT

A substrate structure for manufacturing series interconnected photovoltaic cells comprises repetitive sheets of electrically conductive polymer resin joined by first narrow strips of insulating material. A second narrow dividing strip of insulating material is positioned on the top surface of each electrically conductive sheet extending essentially parallel with but slightly displaced from the joining strips. The second strip divides the top surface of each conductive sheet into a connector area and a collector area. The connector area is positioned between the first and second insulating strips. After deposition of a thin film photovoltaic cell onto the collector area, series interconnection is made by establishing electrical communication between the top surface of the photovoltaic film and the connector area of an adjacent sheet. Electrodeposits on surface portions of the electrically conductive sheets assist in current distribution with minimum power losses.

21 Claims, 7 Drawing Sheets

SUBSTRATE STRUCTURES FOR INTEGRATED SERIES CONNECTED PHOTOVOLTAIC ARRAYS AND PROCESS OF MANUFACTURE OF SUCH ARRAYS

BACKGROUND OF THE INVENTION

Photovoltaic cells have developed according to two distinct methods. The initial operational cells employed a matrix of single crystal silicon appropriately doped to produce a planar p-n junction. An intrinsic electric field established at the p-n junction produces a voltage by directing photon produced holes and free electrons in opposite directions. Despite good conversion efficiencies and long-term reliability, widespread energy collection using single-crystal silicon cells is thwarted by the exceptionally high cost of single crystal silicon material.

A second approach to produce photovoltaic cells is by depositing thin photovoltaic semiconductor films on a supporting substrate. Material requirements are minimized and technologies can be proposed for mass production. The thin film structures can be designed according to doped homojunction technology such as that involving silicon films, or can employ heterojunction approaches such as those using CdTe or chalcopyrite materials.

Despite significant improvements in individual cell conversion efficiencies for both single crystal and thin film approaches, photovoltaic energy collection has been generally restricted to applications having low power requirements. One factor impeding development of bulk power systems is the problem of economically collecting the energy from an extensive collection surface. Photovoltaic cells can be described as high current, low voltage devices. Typically, individual cell voltage is less than one volt. The current component is a substantial characteristic of the power generated. Efficient energy collection from an expansive surface must minimize resistive losses associated with the high current characteristic. A way to minimize resistive losses is to reduce the size of individual cells and connect them in series. Thus, voltage is stepped through each cell while current and associated resistive losses are minimized.

It is readily recognized that making effective, durable series connections among multiple small cells can be laborious, difficult, and expensive. In order to approach economical mass production of series connected arrays of individual cells, a number of factors must be considered in addition to the type of photovoltaic materials chosen. These include the substrate employed and the process envisioned. Since thin films can be deposited over expansive areas, thin film technologies offer additional opportunities for mass production of interconnected arrays compared to inherently small, discrete single crystal silicon cells. Thus a number of U.S. Patents have issued proposing designs and processes to achieve series interconnections among the thin film photovoltaic cells. Many of these technologies comprise deposition of photovoltaic thin films on glass substrates followed by scribing to form smaller area individual cells. Multiple steps then follow to electrically connect the individual cells in series array. Examples of these proposed processes are presented in U.S. Pat. Nos. 4,443,651, 4,724,011, and 4,769,086 to Swartz, Turner et al, and Tanner et al., respectively. While expanding the opportunities for mass production of interconnected cell arrays compared with single crystal silicon approaches, glass substrates must inherently be processed on an individual batch basis.

More recently, developers have explored depositing wide area films using continuous roll-to-roll processing. This technology generally involves depositing thin films of photovoltaic material onto a continuously moving web. However, a challenge still remains regarding subdividing the expansive films into individual cells followed by interconnecting into a series connected array. U.S. Pat. No. 4,746,618 to Nath et al. teaches a design and process to achieve interconnected arrays using roll-to-roll processing of a web substrate such as thin stainless steel. The process includes multiple operations of cutting, selective deposition, and riveting. These operations, combined with the high cost of stainless steel sheet, add considerably to the final interconnected array cost. Similar concerns exist with the teachings of U.S. Pat. Nos. 4,965,655 to Grimmer et. al. and U.S. Pat. No. 4,697,041 to Okaniwa. These references teach processes requiring expensive laser scribing and interconnections achieved with laser heat staking. In addition, the two latter references teach a substrate of thin vacuum deposited metal back contact on films of relatively expensive polymers. The high electrical resistance and fragile nature of thin vacuum metallized layers significantly limits the permissible active area of the individual interconnected cells.

Therefore, there remains a need for improved structures and processes to permit economical production of large area interconnected arrays of photovoltaic cells.

In a somewhat removed segment of technology, a number of electrically conductive fillers have been used to produce electrically conductive thermoplastic materials. This technology generally involves mixing of the conductive filler into the thermoplastic prior to fabrication of the material into its final shape. Conductive fillers typically consist of high aspect ratio particles such as metal fibers, metal flakes, or highly structured carbon blacks, with the choice based on a number of cost/performance considerations.

Electrically conductive plastics have been used as bulk thermoplastic compositions or formulated into paints. Their development has been spurred in large part by electromagnetic radiation shielding and static discharge requirements for plastic components used in the electronics industry. Other known applications include resistive heating fibers and battery components.

In yet another separate technological segment, electroplating on plastic substrates has been employed to achieve decorative effects on items such as knobs, cosmetic closures, faucets, and automotive trim. ABS (acrylonitrile-butadiene-styrene) plastic dominates as the substrate of choice for most applications because of a blend of mechanical and process properties and ability to be uniformly etched. The overall plating process comprises many steps. First, the plastic substrate is chemically etched to microscopically roughen the surface. This is followed by depositing an initial metal layer by chemical reduction. This initial metal layer is normally copper or nickel of thickness typically one-half micrometer. The object is then electroplated with metals such as bright nickel and chromium to achieve the desired thickness and decorative effects. The process is very sensitive to processing variables used to fabricate the plastic substrate, limiting applications to carefully molded parts and designs. In addition, the many steps employing harsh chemicals make the process intrinsically costly and environmentally difficult. Finally, the sensitivity of ABS plastic to liquid hydrocarbons has prevented certain applications. The conventional technology for electroplating on plastic (etching, chemical reduction, electroplating) has been extensively documented and discussed in the public and commercial literature. See, for example, Saubestre, Transactions of the Institute of Metal Finishing, 1969, Vol. 47., or Arcilesi et al., Products Finishing, March 1984.

Many attempts have been made to simplify the process of electroplating on plastic substrates. Some involve special chemical techniques to produce an electrically conductive film on the surface. Typical examples of this approach are taught by U.S. Pat. No. 3,523,875 to Minklei, U.S. Pat. No. 3,682,786 to Brown et. al., and U.S. Pat. No. 3,619,382 to Lupinski. The electrically conductive film produced was then electroplated.

Another approach proposed to simplify electroplating of plastic substrates is incorporation of electrically conductive fillers into the resin to produce an electrically conductive plastic. The electrically conductive resin is then electroplated. Examples of this approach are the teachings of Adelman in U.S. Pat. No. 4,038,042 and Luch in U.S. Pat. No. 3,865,699. Adelman taught incorporation of conductive carbon black into a polymeric matrix to achieve electrical conductivity required for electroplating. The substrate was pre-etched to achieve adhesion of the subsequently electrodeposited metal. Luch taught incorporation of small amounts of sulfur into polymer-based compounds filled with conductive carbon black. The sulfur was shown to have two advantages. First, it participated in formation of a chemical bond between the polymer-based substrate and an initial Group VIII based metal electrodeposit. Second, the sulfur increased lateral growth of the Group VIII based metal electrodeposit over the surface of the substrate.

Since the polymer-based compositions taught by Luch could be electroplated directly without any pretreatments, they could be accurately defined as directly electroplateable resins (DER). Directly electroplateable resins, (DER), are characterized by the following features:

(a) having a polymer matrix;

(b) presence of carbon black in amounts sufficient for the overall composition to have a an electrical volume resistivity of less than 1000 ohm-cm., e.g., 100 ohm-cm., 10 ohm-cm., 1 ohm-cm.;

(c) presence of sulfur (including any sulfur provided by sulfur donors) in amounts greater than about 0.1% by weight of the overall polymer-carbon-sulfur composition; and (d) presence of the polymer, carbon, and sulfur in said directly electroplateable composition of matter in cooperative amounts required to achieve direct, uniform, rapid, and adherent coverage of said composition of matter with an electrodeposited Group VIII -based metal or Group VIII metal-based alloy.

The minimum workable level of carbon black required to achieve electrical resistivities less than 1000 ohm-cm. appears to be about 8 weight percent based on the weight of polymer plus carbon black.

Polymers such as polyvinyls, polyolefins, polystyrenes, elastomers, polyamides, and polyesters are suitable for a DER matrix, the choice generally being dictated by the physical properties required.

In order to eliminate ambiguity in terminology of the present specification and claims, the following definitions are supplied.

"Metal-based" refers to a substance having metallic properties and being composed of two or more elements of which at least one is an elemental metal.

"Polymer-based" refers to a substance composed, by volume, of 50 percent or more hydrocarbon polymer.

"Group VIII-based" refers to a metal (including alloys) containing, by weight, 50% to 100% metal from Group VIII of the Periodic Table of Elements.

It is important to note that electrical conductivity alone is insufficient to permit a plastic substrate to be directly electroplated. The plastic surface must be electrically conductive on a microscopic scale. For example, simply loading a small volume percentage of metal fibers may impart conductivity on a scale suitable for electromagnetic radiation shielding, but the fiber separation would likely prevent uniform direct electroplating. In addition, many conductive thermoplastic materials form a non-conductive surface skin during fabrication, effectively eliminating the surface conductivity required for direct electroplating.

OBJECTS OF THE INVENTION

An object of the present invention is to eliminate the deficiencies in the prior art. Another object of the present invention is to provide an improved substrate to achieve series interconnections among wide area thin film photovoltaic cells. Another object of the present invention is to provide improved interconnected photovoltaic arrays. A further object of the present invention is to provide an improved process whereby wide area series interconnected photovoltaic arrays can be economically mass produced by well-known techniques.

Other objects and advantages will become apparent in light of the following description taken in conjunction with the drawings and embodiments.

SUMMARY OF THE INVENTION

A structure is provided comprising repetitive thin electrically conductive sheets held together by thin joining strips of insulating material. Additional thin dividing strips of insulating material are provided on the top surface of the electrically conductive sheets. The dividing strips extend essentially parallel to but are slightly displaced from the insulating joining strips. The top surface of each electrically conductive sheet consists of two portions. A first contact portion has a relatively small width and is positioned between the two slightly displaced strips of insulating material. The second collector area portion is of substantially wider extent than the first contact portion and is positioned on the opposite side of the insulating dividing strips. A portion of the surface of the electrically conductive sheets comprises a metal-based electrodeposit to facilitate current distribution while minimizing resistive power losses. To complete the interconnected photovoltaic array, an active thin film photovoltaic laminate is deposited on the top collector area surface of the substrate. Thereafter, series connections are completed by electrically connecting the top collector surface of each cell with the contact surface portion of the adjacent cell across the insulating joining strips. The latter electrical connecting can be simply accomplished by any of a number of selective deposition procedures.

As will be shown, the substrate structure and integrated arrays of the invention can be produced by simple, well-known, and inexpensive mass production technologies using inexpensive common materials.

BRIEF DESCRIPTION OF THE DRAWINGS

The various factors and details of the series connected integrated arrays of the present invention and the methods for making the arrays are hereinafter more fully set forth with reference to the accompanying drawings wherein.

DESCRIPTION OF PREFERRED EMBODIMENTS

Reference will now be made in detail to the preferred embodiments of the invention, examples of which are illustrated in the accompanying drawings.

Figure 1:
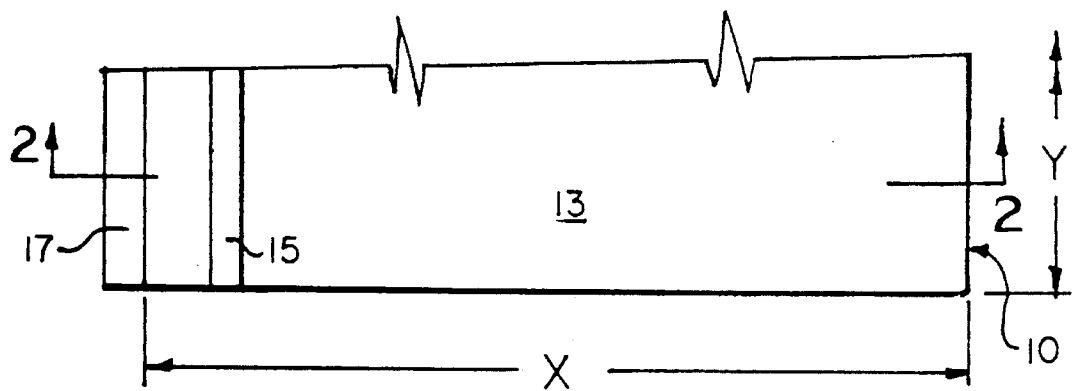
FIG. 1 is a top plan view showing a form of the polymeric substrate for one of the repetitive units in the final series connected array.
Figure 2:
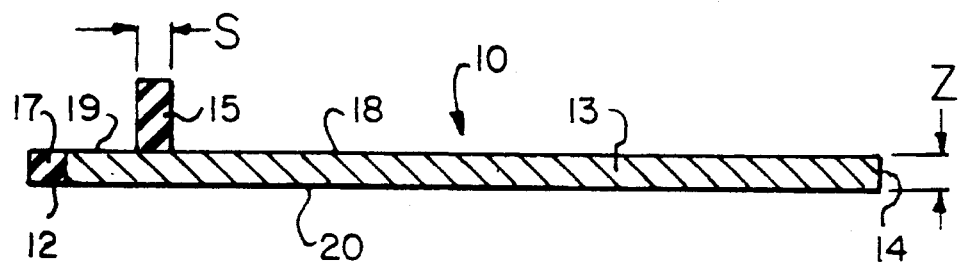
FIG. 2 is a sectional view taken substantially along the line 2—2 of FIG. 1.

A single unit of polymeric substrate for the series interconnected photovoltaic array is generally indicated by 10 as shown in FIGS. 1 and 2. Unit substrate 10 comprises electrically conductive polymer based sheet 13, electrically insulating dividing strip 15 and electrically insulating joining portion 17. Electrically conductive sheet 13 has a top collector surface 18, top contact surface 19, and bottom surface 20. Sheet 13 is characterized by having a width X, length Y, and thickness Z as shown in FIG. 1 and 2. Dimensions X and Y are much larger than thickness Z. Typical dimensions for the structure are as follows:

X–0.5 cm–15 cm
Y–Greater than 0.20 cm
Z–5 micrometers–500 micrometers

Width X defines a first terminal edge 12 and a second terminal edge 14.

Sheet 13 typically comprises material having bulk resistivity of less than 1000 ohm-cm. Resistivities less than 1000-ohm-cm can be readily achieved by compounding well-known conductive fillers into a polymer matrix binder.

Electrically insulating dividing strip 15 extends in the direction of length Y and separates the top surface of sheet 13 into two areas 18 and 19. This special and electrical separation allows for selectivity in subsequent deposition of functional films. The material chosen for strip 15 varies depending on desired overall function. For example, if strip 15 is envisioned to remain as pad of the final interconnected array, strip 15 would typically comprise a material capable of achieving good bonding to sheet 13. In this case, strip 15 may simply be an adhesive, a material bonded to surface 18 with an adhesive, a polymer compatible with that forming the matrix of sheet 13 at surface 18, or even mechanically bonded strips such as an embedded fiber.

On the other hand, it may be desirable to remove a portion or all of strip 15 material at some point during manufacture of the completed array. In this case, strip 15 may comprise a material which dissolves in a liquid which is not a solvent for the other array materials, or a material which is only weakly bonded to the sheet 13, enabling easy removal.

In order to minimize shading resulting from strip 15, width S (FIG. 2) is kept small. Typical values for width S are 10–1000 micrometers.

Figure 3:
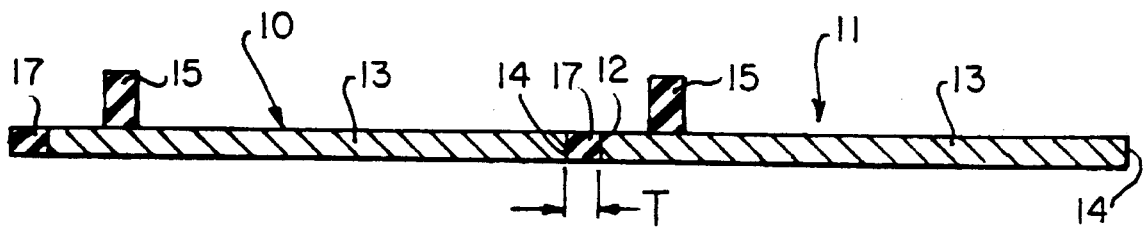
FIG. 3 is a sectional view similar to FIG. 2 showing two repetitive units.

FIG. 3 shows one embodiment for joining the repetitive units 10 and 11 of starting substrate. Joining portion 17 comprises an insulating material having good adhesive or mechanical attachment to the electrically conductive sheets 13. Attachment of portion 17 to conductive sheets 13 is made close to or at terminal edges 12, 14 and extends in the direction of length Y. Such a structure can be achieved inexpensively and in high volume using thermoplastic extrusion of alternating portions 17-13-17-13 etc. In this process, alternating dies form the alternating portions 17-13- 17-13 etc. and the portions are quickly adhesively bonded while still in their molten state. Additional dies can be used to apply strip 15. In order to maximize the photovoltaic surface area, width T of joining portion 17 is kept small. The minimum width T of joining portion 17 is normally dictated by the precision of the fabrication process for the substrate structure. Typical values for T are from 250–5000 micrometers.

Figure 4:
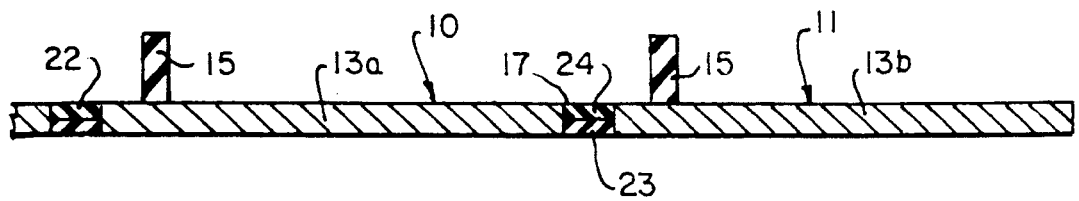
FIG. 4 is a sectional view similar to FIG. 3 showing an alternate way of joining adjacent units.

FIG. 4 illustrates an alternative way to join adjacent units 10 and 11. Prior to joining of units 10 and 11, insulating portions 22 and 23 are bonded to opposite edges of sheet 13a of unit 10. Similarly, insulating portion 24 is attached to sheet 13b of unit 11. Units 10 and 11 are joined by welding or adhesive bonding of portions 23 and 24.

Figure 5:
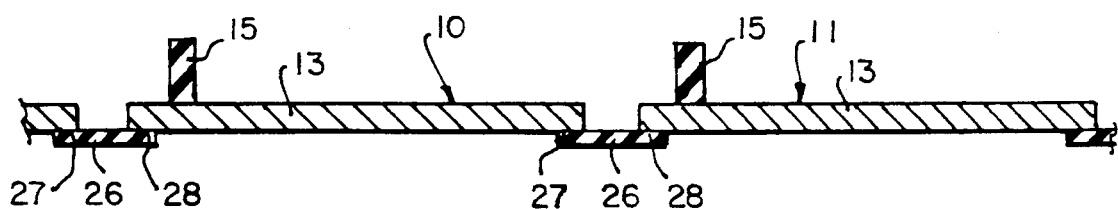
FIG. 5 is a sectional view similar to FIGS. 3 and 4 showing another alternative for joining adjacent units.

FIG. 5 illustrates yet another alternative design for joining adjacent units 10 and 11. Thin insulating strip 26 is attached at surface areas 27 and 28 of adjacent units 10 and 11 respectively. Attachment at surfaces 27 and 28 can be mechanical or adhesive in nature. Strip 26 is advantageously a compound of a material selected to impart good mechanical strength and dimensional stability to the final interconnected array. For example, polymers heavily loaded with glass fibers would be good candidates for strip 26.

Figure 6:
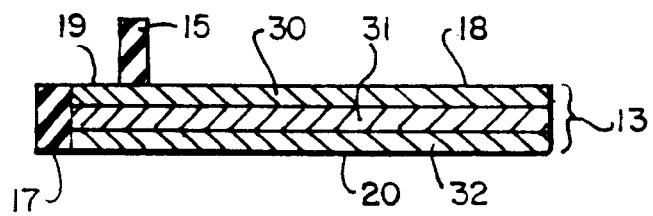
FIG. 6 is a sectional view showing an alternative structure for the repetitive units of the polymeric substrate.

FIG. 6 illustrates an embodiment in which the conductive sheet 13 is composed of multiple layers in laminated form. Three distinct conductive layers, 30, 31, and 32 form the composite conductive sheet 13. The invention contemplates using multiple layers for manipulating the functional, mechanical, or fabrication characteristics of the array.

A number of factors must be considered when choosing the laminated structure illustrated by FIG. 6. Normally the bottom surface 20 presented by layer 32 is chosen to be electroplateable for reasons presented later. The laminated layer must be bonded with sufficient integrity to avoid excessive resistive power losses at the interfacial surfaces between layers. Finally, while the actual intrinsic resistivities of the individual layers may differ among themselves, no layer should significantly resist electrical current flow.

The structures depicted by FIGS. 1 to 6 can be achieved using thermoplastic materials and processing such as extrusion and thermal adhesive bonding. This attribute is a primary advantage of the invention in that high volume, inexpensive fabrication techniques are employed to produce the starting polymeric substrate.

Figure 7:
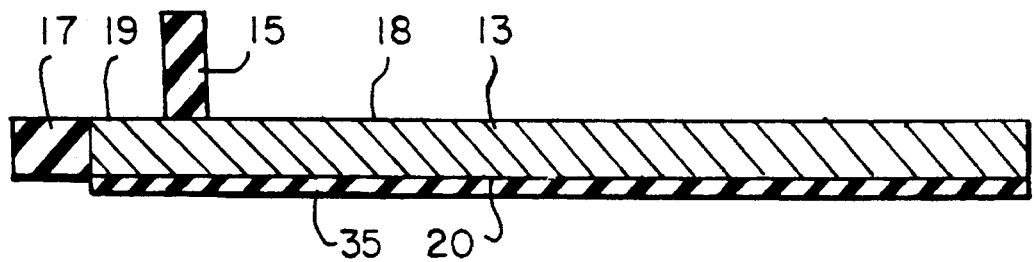
FIGS. 7–9 are sectional views showing alternative intermediate structures achieved during manufacture of the final series connected array.
Figure 8:
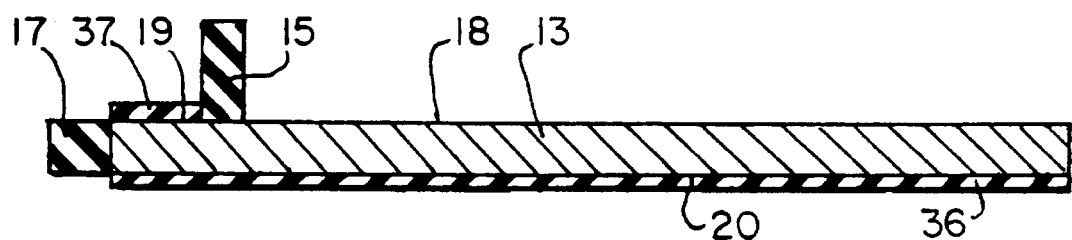
Figure 9:
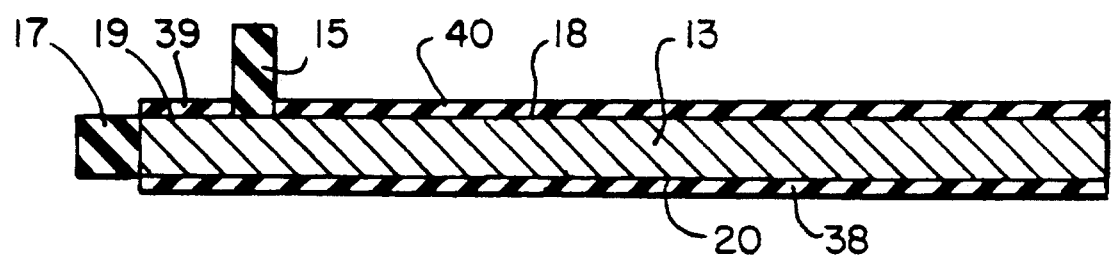

FIGS. 7 through 9 show alternative constructions of individual units at an intermediate stage in the manufacture of the integrated photovoltaic array. FIG. 7 shows a metal-based electrodeposit 35 adherent to bottom surface 20 of conductive sheet 13. Surfaces 18 and 19 have been masked or otherwise prevented from being coated with electrodeposit. The electroplated metal adherent to the bottom surface of the conductive sheet 13 is an important feature of the present invention. Resistivities for typical conductive plastics can be orders of magnitude greater than metals. Since the thickness "Z" of the conductive sheet is small, power losses from current transport over distance "Z" will be small despite the relatively high resistivity of the conductive resin layer. However, the width "X" of the individual units is relatively large in comparison to "Z". Current transport exclusively through the conductive polymer in the "X" direction would involve significant resistive power losses. Electrodeposition of the bottom surface of the conductive sheet supplies a mechanically robust, highly conductive current distribution mechanism to allow a more expansive top collector surface 18.

An alternative to electrodeposit 35 would be to employ extremely high loadings of conductive filler in conductive sheet 13. High filler loadings are generally costly and negatively impact the mechanical properties and processing characteristics of polymers. However, using laminate structures such as illustrated in FIG. 6, high filler loadings could be employed in one of the resin layers with the remaining layer chosen for processing and mechanical characteristics.

FIG. 8 shows metal-based electrodeposits 36 and 37 adherent to surfaces 20 and 19 respectively. FIG. 9 shows metal-based electrodeposits 38, 39, and 40 adherent to surfaces 20, 19, and 18, respectively.

A broad variety of metal-based electrodeposits and electrochemical processes can be considered for the substrate of the present invention. Selectivity is readily achieved through masking or otherwise isolating the surface from the electrochemical solution. It is noted that because of the selective characteristic achievable with electrodeposition, the electrodeposits adherent to surfaces 20, 19, and 18 in FIGS. 7–9 can differ among themselves to achieve desired effects. For example, using the embodiment of FIG. 9, electrodeposit 38 may comprise copper for excellent conductivity and solderability while electrodeposit 39 may comprise a metal such as zinc which could be chromated to enhance adhesion of a subsequently applied film. Further, the exterior surface of electrodeposit 40 would be material compatible with a subsequently applied photovoltaic film.

It is further noted that the electrodeposits 35–40 of FIGS. 7–9 may consist of a single electrodeposited layer or may be a laminated structure of sequentially deposited layers.

Many of the embodiments of the present invention comprise metal-based electrodeposits adherent to portions of the top or bottom surfaces of the electrically conductive polymer-based sheets. In these embodiments it is often advantageous to employ a directly electroplateable resin (DER) at the surface of the electrically conductive polymer sheet intended to be electroplated. DERs provide adequate electrical conductivity for the application as well as ensuring rapid lateral growth of adherent electrodeposit over the expansive surface envisioned.

Figure 10:
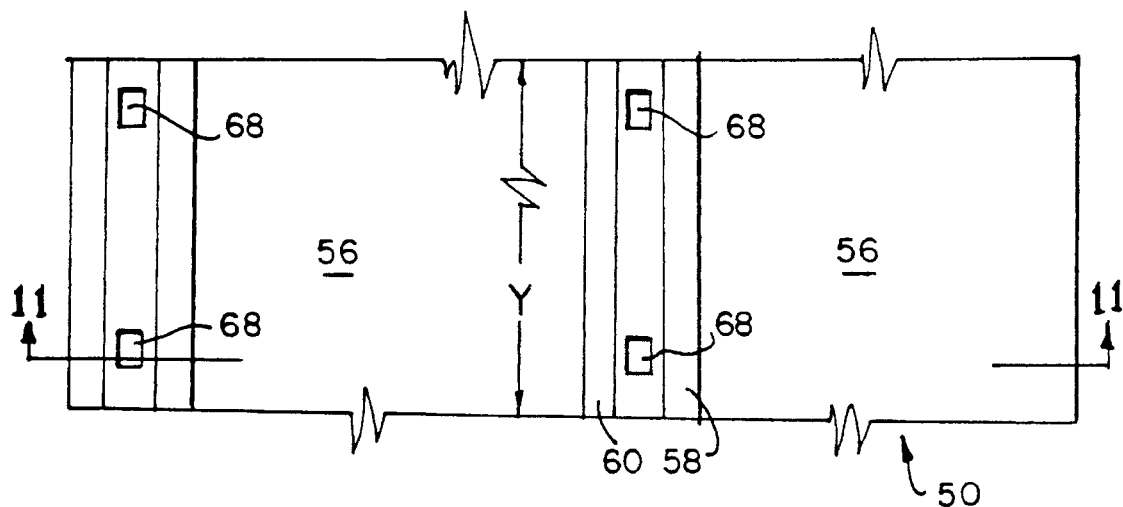
FIG. 10 is a top plan view showing an alternative construction of the polymeric substrate for production of the final series connected array.
Figure 11:
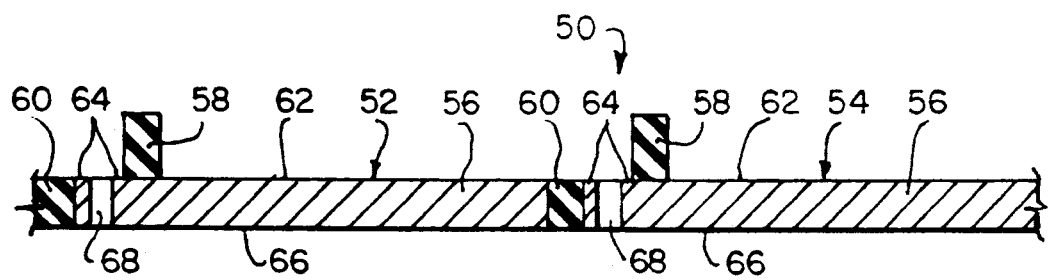
FIG. 11 is a sectional view taken substantially along the line 11—11 of FIG. 10.

Turning now to FIGS. 10 and 11, an alternative embodiment for the starting polymer-based substrate is generally indicated by arrow 50. Embodiment 50 comprises adjacent units 52 and 54. Units 52 and 54 form two of any desired number of units connected in similar fashion. Units 52 and 54 comprise electrically conductive polymer-based sheets 56, electrically insulating dividing strips 58, and electrically insulating joining portions 60. Sheets 56 have three distinct surface portions 62, 64, and 66 as best shown in FIG. 11. Top contact surfaces 64 are positioned between dividing and joining strip portions 58 and 60, respectively. Contact surfaces 64 and bottom surfaces 66 are capable of being electroplated with an adherent metal-based electrodeposit. Top collector surface 62 defines the area to be used to eventually deposit the photovoltaic cell. Electroplating of surface 62 is optional, as will be explained below.

Holes 68 through sheet 56 are positioned respectively along the length Y of embodiment 50 to allow communication between surfaces 64 and 66 of units 52 and 54. Holes 68 can be readily and precisely formed by mechanical punching or laser drilling.

Figure 12:
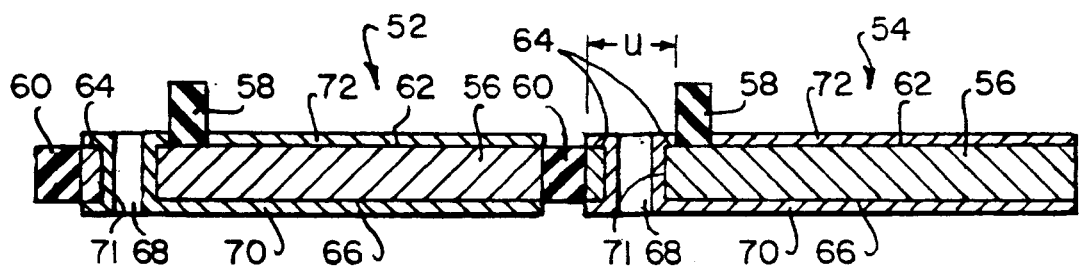
FIG. 12 is a sectional view showing an intermediate structure achieved during manufacture of the final series connected array using the polymeric substrate of FIGS. 10 and 11.
Figure 13:
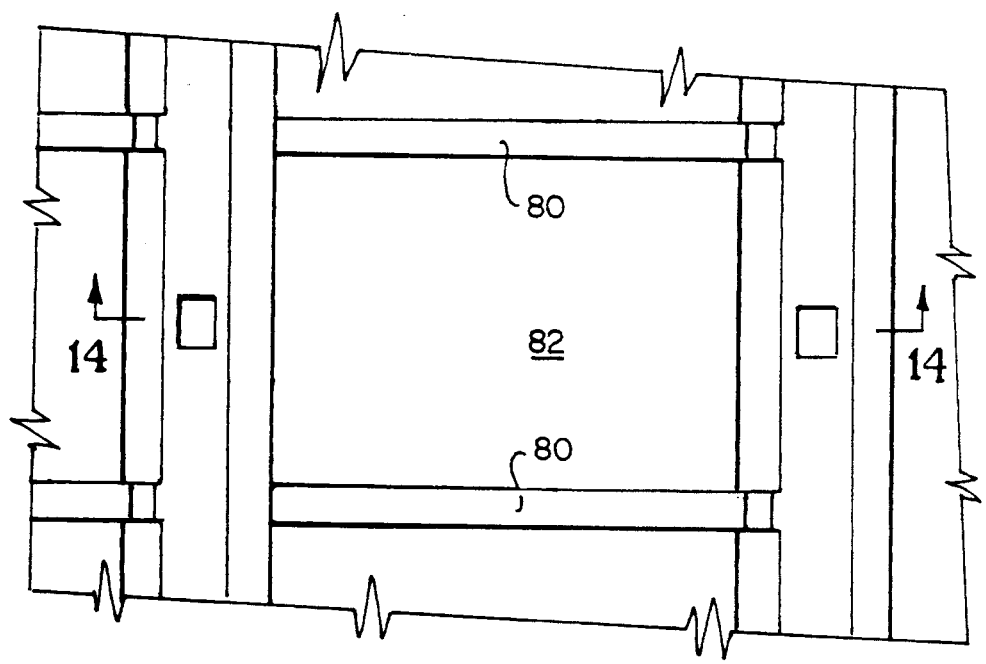
FIG. 13 is a top plan view showing an embodiment of a completed series connected photovoltaic army using the substrate structure of FIGS. 10 through 12.
Figure 14:
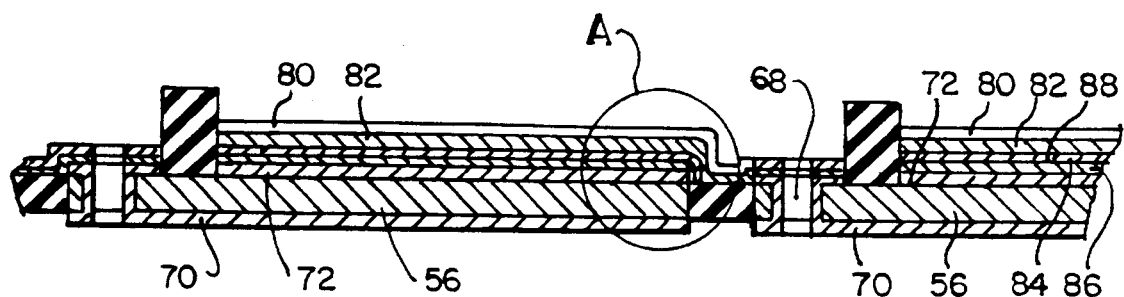
FIG. 14 is a sectional view taken substantially along lines 14—14 of FIG. 13.
Figure 15:
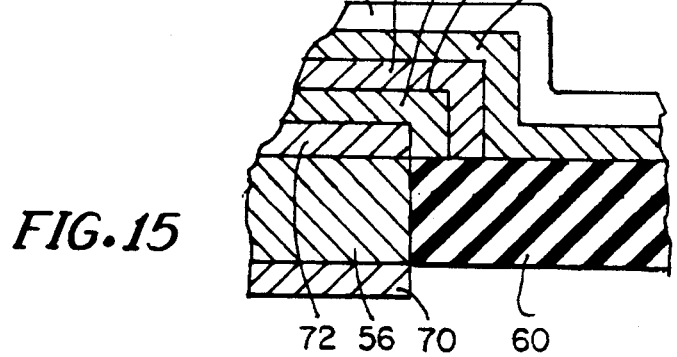
FIG. 15 is an enlarged view of the portion within circle "A" of FIG. 14.
Figure 16:
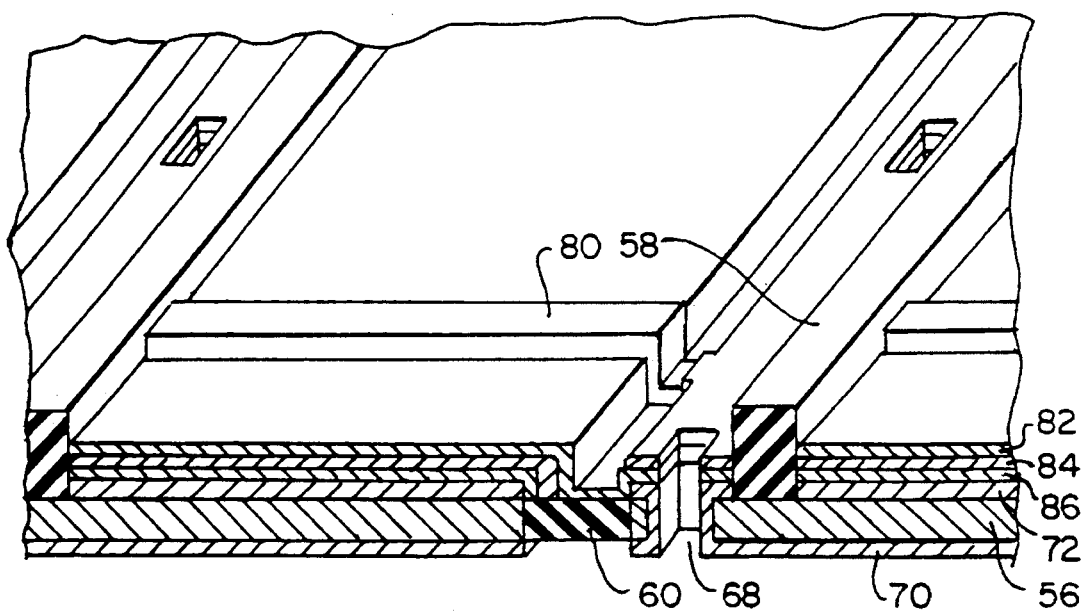
FIG. 16 is a perspective view partially in section of the embodiment shown in FIGS. 13 and 14.

Having started with the embodiment of FIGS. 10 and 11, FIG. 12 illustrates a further stage in the manufacturing of the integrated series connected array. As shown in FIG. 12, a metal-based electrodeposit 70 has been applied to surfaces 64 and 66. Continuous electrodeposit communication is achieved from top contact surface 64 to bottom surface 66 by way of the electrodeposit 70 extending through holes 68. The electrically conductive sides 71 of holes 68 permit the through-hole electrodeposition.

One skilled in the art readily recognizes that the conductivity associated with the metal electrodeposit is orders of magnitude greater than can be achieved with electrically conducting polymer sheets 56. Forcing all the photogenerated current to traverse the relatively restricted cross-sectional area defined by surface 64 could lead to significant resistive losses if the conductive polymer were the sole conductive medium. The through-hole electroplating avoids these resistive losses and permits the width "u" (FIG. 12) of surface 64 to be minimized.

Electrodeposit 72 is shown in FIG. 12 adherent to surface 62. As will be explained below, electrodeposit 72 is optional. However, if electrodeposit 72 is employed as shown in FIG. 12, it is not required to be the same or equivalent to electrodeposit 70. Electrodeposit 72 should be chosen to have good ohmic compatibility with the subsequently applied photovoltaic films as will be shown.

FIGS. 13 through 16 suggest a form of the final integrated series connected photovoltaic array resulting from further processing of the embodiment of FIG. 12. Semiconductor layers 86 and 84 are deposited onto electrodeposit 72 to form photovoltaic junction 88. Conductive, optically transparent window electrode 82 covers semiconductor layer 84. Electrically conductive collector grid fingers 80 are deposited onto electrode 82.

It will be noted by those skilled in the art that the unique substrate structure taught in the embodiments of FIGS. 1–12 is suitable for use with a multiplicity of thin film photovoltaic cells. The exact nature and composition of the films 84, 86 and junction 88 in FIGS. 13 through 16 can be chosen in consideration of other criteria such as environmental stability and cell efficiency. However, it is noted that certain photovoltaic semiconductor films that can be electroplated, such as copper indium diselenide or cadmium telluride, may be uniquely suitable for the substrate of the present invention. Furthermore, composition and processes for forming top electrode 82 and collector grid 80 are well known in the an and do not form the subject matter of the present invention.

Figure 17:
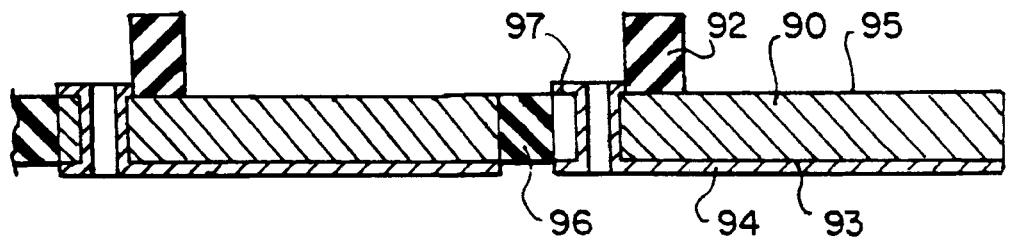
FIG. 17 is a sectional view showing an alternative intermediate structure achieved with the starting substrate of FIGS. 10 and 11.
Figure 18:
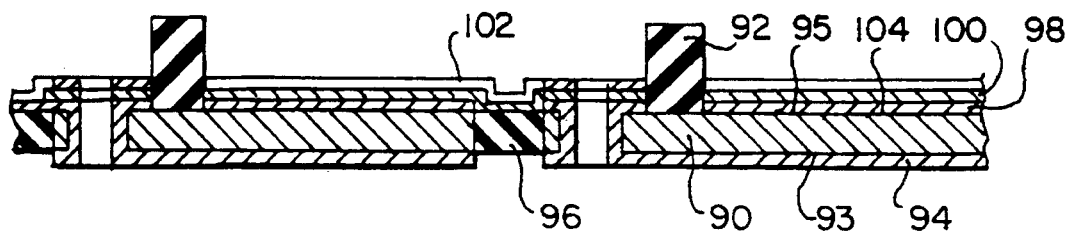
FIG. 18 is a sectional view of an embodiment of a series connected photovoltaic array resulting from further processing of the structure of FIG. 17.

Additional embodiments of the present invention are illustrated in FIGS. 17 through 20. In FIGS. 17 and 18, 96 represents an insulating joining portion, similar to 17 and 60 of previous embodiments. 92 indicates the insulating dividing strip. Electrodeposit 94 is adherent to bottom surface 93 and top contact surface 97. Electrically conductive polymer sheet 90 comprises electroplateable bottom surface 93 and top collector surface 95. Surface 95 comprises a polymer matrix functioning as a binder for an electrically conductive filler. Suitable dopants are incorporated into the conductive polymer forming surface 95. The dopants participate in formation of a subsequently grown, adherent semiconductor thin film.

One possible construction is shown in FIG. 18. In FIG. 18, thin semiconductor film 98 is a reaction product of a dopant present at surface 95 of conductive polymer sheet 90 and additional species brought into contact with the surface. Contact with the additional species may be brought about by immersion in either liquid or vapor, and the reaction may be electrochemical and entirely chemical in nature. Photovoltaic junction 104 is formed between the electrically conductive polymer base 90 and the semiconductor film 98. Transparent top window electrode 100 and collector grid 102 are subsequently applied to complete the integrated photovoltaic array.

An example of the embodiment of FIG. 18 was prepared as follows. A thin piece of directly electroplateable plastic (DER) containing conductive carbon black, dissolved sulfur, and polypropylene matrix was chosen to constitute conductive sheet 90. This thin piece of directly electroplateable plastic was placed in an aqueous solution of nickel salt at a low cathodic potential of approximately 0.1 volt. An adherent uniform thin film of semiconductor, identified as nickel sulfide, formed over the surface. A potential photovoltaic junction was thus formed between the directly electroplateable polymer and the cathodically grown sulfide semiconductor. Similar semiconductor film growth was observed using copper containing electrolytes.

Figure 19:
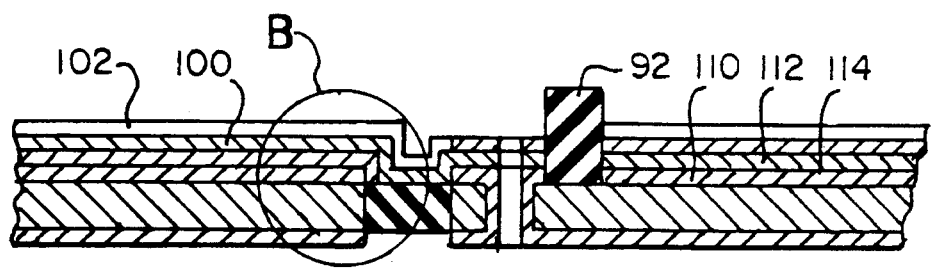
FIG. 19 is an alternate construction resulting from further processing of the structure of FIG. 17.
Figure 20:
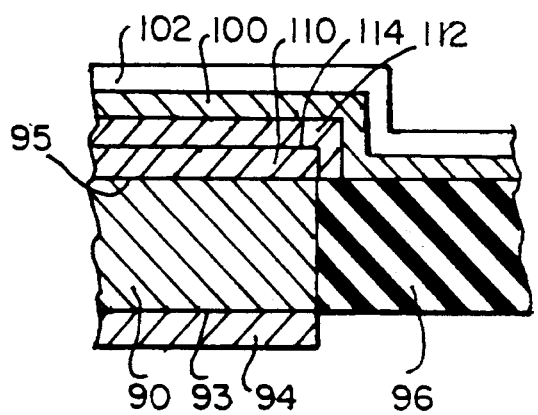
FIG. 20 is an enlarged view of the portion within circle "B" of FIG. 19.

FIGS. 19 and 20 illustrate a further embodiment produced using a reactive dopant to grow an adherent semiconductor film onto the surface of an electrically conductive polymer. In FIGS. 19 and 20, semiconductor layer 110 is grown using the reactive dopant technology described in conjunction with FIG. 18. A suitable complementary semiconductor layer 112 is subsequently applied to form photovoltaic junction 114. Electrically conductive transparent top electrode 100 and collector grid 102 are than applied to complete the interconnected array.

The reactive doping techniques taught in conjunction with FIGS. 17 through 20 offer an inexpensive, simple method for forming adherent photoactive semiconductor films onto a fully series connected integrated array.

Figure 21:
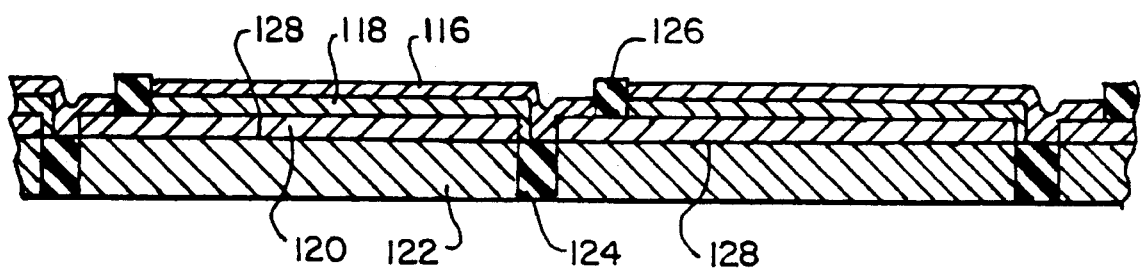
FIG. 21 is a sectional view showing an additional alternate intermediate structure in manufacture of the series connected array.

FIG. 21 illustrates yet another embodiment of the substrate structure of the invention. Here surface 128 of electrically conductive polymer sheet 122 is electroplateable to permit electrodeposition of adherent metal-based electrodeposit 120. Joining strips of insulating material 124 allow selective electrodeposition of metal-based layers 120. After electrodeposition of metal-based layers 120, insulating dividing strips 126 are applied to the surface of layers 120. Dividing strips 126 facilitate selective deposition of photovoltaic semiconductor laminate 118 and window collector electrode 116. It is to be understood that, while not shown, laminate 118 comprises at least two semiconductor layers forming the photovoltaic junction. Similarly, electrode 116 may comprise transparent window and grid structures as shown in previous embodiments.

Although the present invention has been described in conjunction with preferred embodiments, it is to be understood that modifications, alternatives and equivalents may be included without departing from the spirit and scope of the inventions, as those skilled in the art will readily understand. Such modifications, alternatives and equivalents are considered to be within the purview and scope of the invention and appended claims.

What is claimed is:

1. A substrate structure for series interconnected photovoltaic cell arrays, said substrate structure comprising one or more individual units, each said unit comprising:

a sheet of electrically conductive material, said sheet having a length, width, thickness, a top surface and a bottom surface, said width being defined as the distance between a first terminal edge and a second terminal edge of said sheet;

means for providing an electrically insulating strip of material positioned on said top surface and extending in the direction of said length, said insulating strip positioned between and defining a top contact surface area and a top collector surface area;

an electrically insulating joining portion extending in the direction of said length and attached to said conductive sheet close to or at said first terminal edge;

said sheet further comprising an electrically conductive polymer-based resin.

2. A substrate structure according to claim 1 comprising at least two said units, said joining portion of one of said two units being attached close to or at the second terminal edge of the electrically conductive sheet of the other said two units.

3. A substrate structure according to claim 1 wherein said sheet of electrically conductive material comprises a laminate of multiple distinct layers.

4. A substrate according to claim 3 wherein at least one of said layers is a metal containing layer.

5. A substrate structure according to claim 4 wherein said metal containing layer comprises an electrodeposited metal or metal-based alloy.

6. A substrate structure according to claim 4 wherein said metal containing layer comprises a Group VIII based metal or Group VIII based metal alloy.

7. A substrate structure according to claim 1 wherein said electrically conductive sheet includes a directly electroplateable resin.

8. A substrate structure according to claim 1 wherein said bottom surface is formed by a metal containing layer.

9. A substrate structure according to claim 1 further comprising one or more holes positioned within said top contact surface area, said holes extending through said electrically conductive sheet.

10. A substrate structure according to claim 9 which further comprises a metal containing deposit extending through said holes to provide enhanced electrical conductivity between said top contact surface area and said bottom surface.

11. A substrate structure according to claim 10 wherein said metal containing deposit is an electrodeposit.

12. A substrate structure according to claim 1 wherein said top collector surface area is formed by a metal containing material layer.

13. A substrate structure according to claim 12 wherein said metal containing layer is metal-based.

14. A substrate structure according to claim 13 wherein said metal-based layer is an electrodeposit.

15. A substrate structure according to claim 1 wherein said top collector surface area is formed by a polymer-based semiconductive material layer chosen to form a photovoltaic junction with a subsequently deposited semiconductor.

16. A substrate structure according to claim 1 wherein said top collector surface area is formed by a material containing a dopant additive, said dopant being reactive with an additional material species to form a thin film semiconductor layer.

17. A process for producing a substrate structure in the manufacture of series interconnected photovoltaic cell arrays comprising:

extruding electrically conductive thermoplastic resin into sheets of width perpendicular to the extrusion direction and length in the extrusion direction, said sheets having first and second terminal edges extending in the length direction, joining multiple sheets together in the length direction with first strips of insulating material attached in proximity to both the first terminal edge of one sheet and the second terminal edge of an adjacent sheet.

18. A process as in claim 17 which further comprises depositing a metal containing material onto a portion of the surface of said conductive sheets.

19. A process as in claim 18 wherein said metal containing material is electrodeposited.

20. A process as in claim 17 which further comprises providing means for a second strip of insulating material positioned essentially parallel to said first strip.

21. An intermediate article in the manufacture of series interconnected photovoltaic cell arrays, said intermediate article comprising one or more individual units, each said unit comprising:

a sheet of electrically conductive material, said sheet having a length, width, thickness, a top surface and a bottom surface, said width being defined as the distance between a first terminal edge and a second terminal edge of said sheet;

an electrically insulating strip of material positioned on said top surface and extending in the direction of said length, said insulating strip positioned between and defining a top contact surface area and a top collector surface area;

an electrically insulating joining portion extending in the direction of said length and attached to said conductive sheet close to or at said first terminal edge;

said sheet further comprising an electrically conductive polymer-based resin.

* * * * *